United States Patent [19]

Stroud

[11] Patent Number: 4,582,422
[45] Date of Patent: Apr. 15, 1986

[54] APPARATUS FOR FORMING RELIEF PLATES FROM LIQUID PHOTO-SENSITIVE RESIN

[76] Inventor: Edward J. F. Stroud, 4 Junction Rd., P.O. Box 3, McKeller, Ontario, Canada, P0G 1C0

[21] Appl. No.: 634,052

[22] Filed: Jul. 24, 1984

[30] Foreign Application Priority Data

Jul. 25, 1983 [GB] United Kingdom ............... 8319979

[51] Int. Cl.[4] ............................................. G03B 27/04
[52] U.S. Cl. ....................................... 355/85; 355/72; 264/300; 264/327
[58] Field of Search .................... 355/84, 85, 100, 132, 355/99, 127, 26, 72, 73, 78; 264/300, 327

[56] References Cited

U.S. PATENT DOCUMENTS

| | | | |
|---|---|---|---|
| 601,882 | 4/1898 | Schwarz | 355/127 |
| 2,534,784 | 12/1950 | Maxwell | 355/85 |
| 2,638,040 | 5/1953 | Murphy | 355/85 |
| 3,266,402 | 8/1966 | Benson | 355/85 |
| 3,385,193 | 5/1968 | Dougherty et al. | 355/93 |
| 3,520,606 | 7/1970 | Gush et al. | 355/85 |
| 3,597,080 | 8/1971 | Gush et al. | 355/85 |
| 3,632,207 | 1/1972 | Wachter | 355/85 |
| 3,635,559 | 1/1972 | Harrell et al. | 355/85 |
| 3,738,748 | 6/1973 | Weihsmantel et al. | 355/121 |
| 3,771,869 | 11/1973 | Diehl et al. | 355/85 |
| 3,813,162 | 5/1974 | Watabe et al. | 355/85 |
| 3,826,572 | 7/1974 | Duerr | 355/93 |
| 4,193,798 | 3/1980 | Sano et al. | 355/85 X |
| 4,311,381 | 1/1982 | Nettesheim et al. | 355/100 |
| 4,343,549 | 8/1982 | Nanjo | 355/113 |

Primary Examiner—Russell E. Adams
Assistant Examiner—Brian W. Brown
Attorney, Agent, or Firm—James T. Wilbur

[57] ABSTRACT

Two platens having glass plates are pivotally interconnected by means of hinges and U-shaped brackets. Spring loaded fasteners hold the platens closed but the fasteners may be opened to permit the platens to pivot open. The two platens are seated one on top of the other upon a housing within which are mounted lamps which produce ultra-violet rays. The position of the platens can be reversed so that the lower platen is on top of the upper platen. There is a cavity between the closed platens for accommodation of a negative, a layer of photo-sensitive composition and bearer strips. The photo-sensitive composition is exposed to the ultra-violet rays first on one side then on the other by reversal of the positions of the platens so that both a base on one side and a raised image on the other side are formed. The thickness of the bearer strips governs the thickness of the finished printing plate. The brackets and fasteners bias the platens together with resulting pressure upon the photo-sensitive composition within the cavity during the time that the photo-sensitive composition is exposed to the ultra-violet rays.

11 Claims, 10 Drawing Figures

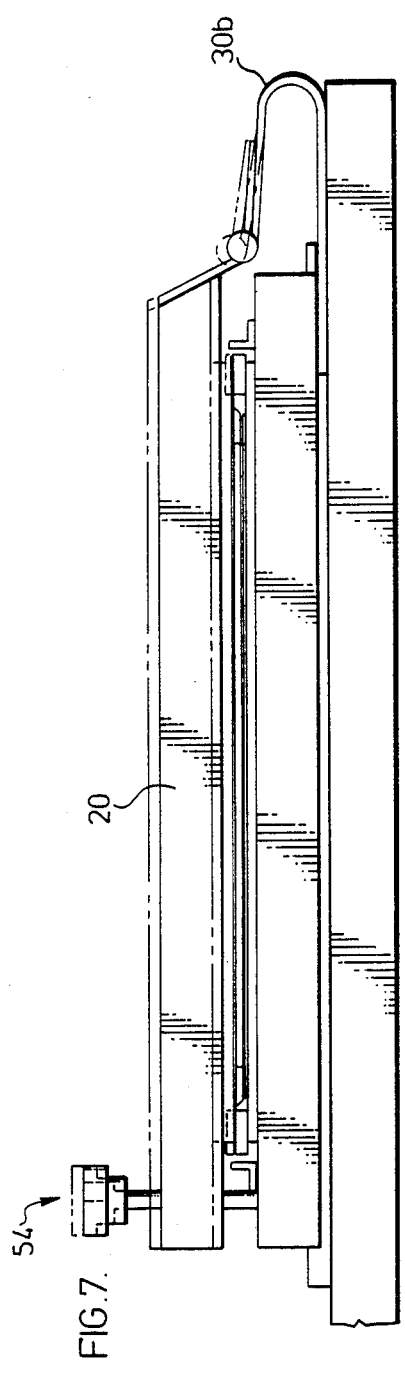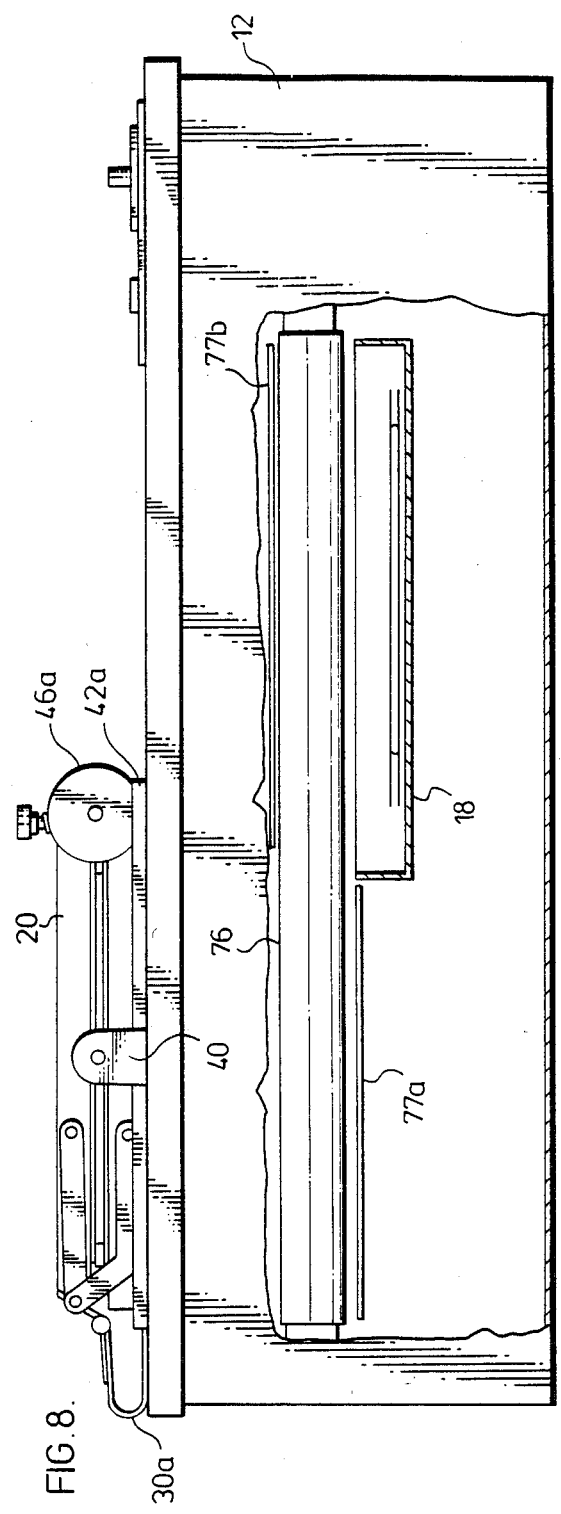

4,582,422

APPARATUS FOR FORMING RELIEF PLATES FROM LIQUID PHOTO-SENSITIVE RESIN

BACKGROUND OF THE INVENTION

This invention relates to apparatus for forming a relief printing plate from a liquid photo-sensitive composition. More particularly the invention relates to apparatus having a reversible exposure frame which permits exposure of alternate sides of a layer of photo-sensitive composition to actinic rays whereby both the backing and the image in relief can be produced from a single source of actinic rays.

According to conventional practice a printing plate in which the printing image is raised or in relief is produced by placing an image bearing negative upon a plate of glass. Over the negative is placed a transparent protective film and over the film is spread a layer of liquid photo-sensitive composition. Finally a sheet of mylar or other backing material is placed over the liquid composition. Actinic rays are directed on the side of the layer of photo-sensitive composition adjacent to the negative so that those areas of the composition adjacent to clear areas of the negative are exposed to the rays while areas adjacent to opaque areas of the negative are not.

Following exposure of the actinic rays, the resulting product is immersed in a so-called "wash-out" solution. Areas of the photo-sensitive layer which are exposed to the rays are soluble in the solution while areas not exposed to the rays are insoluble. The product is agitated or brushed in the solution in order to cause the soluble component of the photo-sensitive layer to separate leaving a surface in which the printing image is raised or in relief. The thus obtained product is then dried and is subjected to a post-exposure treatment in order to make it suitable for use as a printing plate.

Known apparatuses suitable for carrying out the various steps in the production of a relief printing plate, particularly apparatuses suitable for production on a small scale, have a number of shortcomings. Some require frequent handling during the the time that the image in relief and the base for the plate are formed and in the interval of time between the various steps in the process. Other machines require at least two sources of actinic rays, one for formation of the image in relief and another for formation of the base for the plate. Still others are unwieldy and complicated of operation and can generally only be operated efficiently by skilled operators.

SUMMARY OF THE INVENTION

It is an object of this invention to provide an apparatus for formation of relief printing plates which apparatus is simple and economical of construction and operation and which is suitable for production on a small scale.

Another object of the invention is to provide an apparatus in which only one source of actinic rays is required to produce the image in relief, a base or floor for the plate and to subject the plate to post-exposure following formation of the image and the base.

A still further object is provide an apparatus which permits adjustment of the thickness of the plate within a range which encompasses most commercial requirements.

These and other objects of the invention are accomplished by an apparatus for forming a relief printing plate from a photo-sensitive composition having a source of actinic rays, the apparatus comprising: an exposure frame having a pair of plates through which actinic rays may pass and being spaced apart to define a cavity for accommodation of an image bearing negative and a layer of photo-sensitive composition therebetween; and resilient means for biasing the plates toward each other with resulting inward pressure upon the composition, the resilient means permitting enlargement of the cavity such that the thickness of the layer of photo-sensitive composition can be adjusted.

DESCRIPTION OF THE DRAWINGS

The invention is described in detail with reference to the accompanying drawings in which:

FIGS. 4,5,6 and 7 are elevations in enlarged scale of the various positions of the exposure frame;

FIG. 8 is an elevation, partly cut away, of the apparatus of the invention; and

Like reference characters refer to like parts throughout the description of the drawings.

DESCRIPTION OF PREFERRED EMBODIMENT

Figure 1:
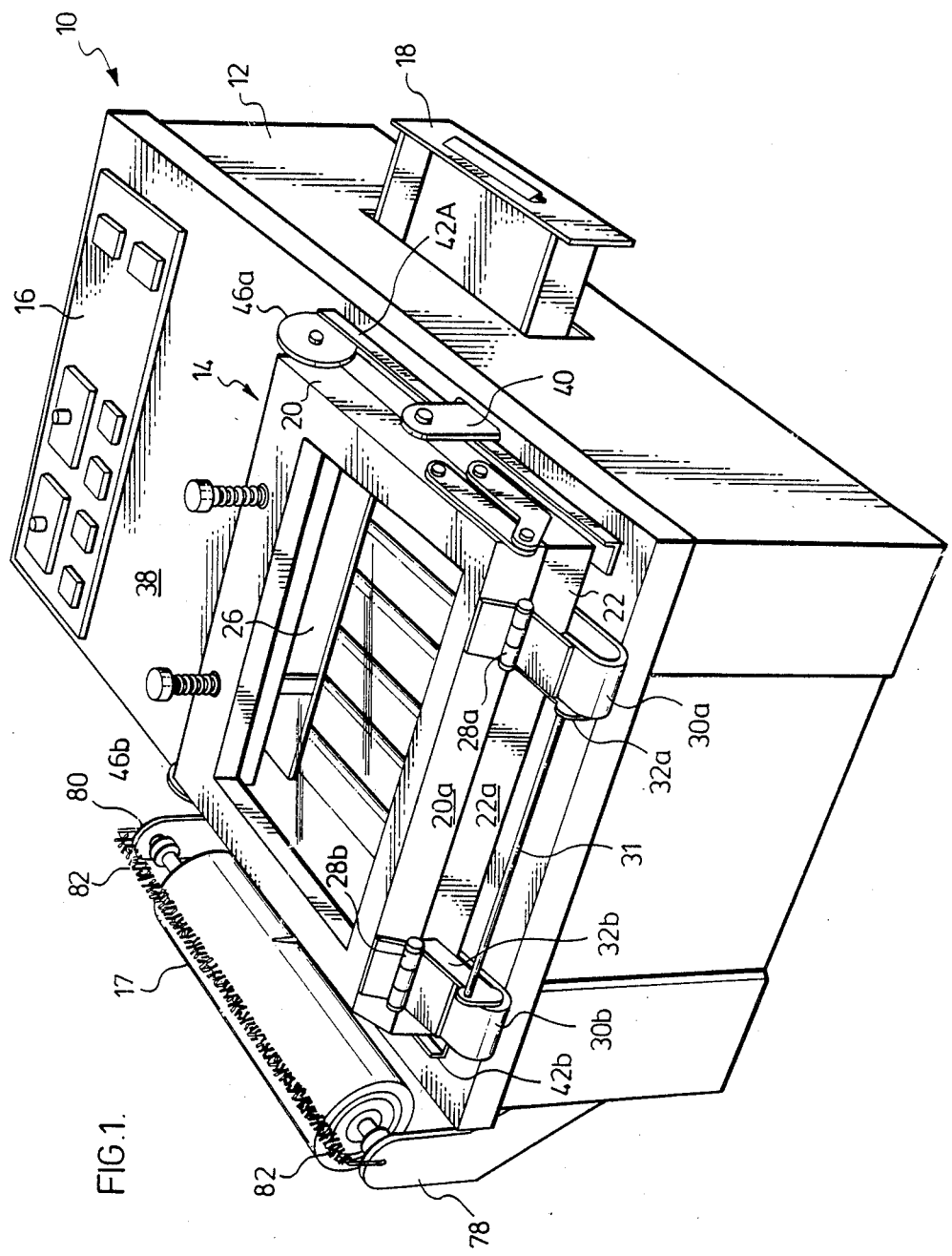
FIG. 1 is a perspective view of the apparatus of the invention.

With reference to FIG. 1, the apparatus for production of a printing-plate in accordance with the present invention, indicated generally by the numeral 10, is made up a housing 12 on which is mounted an exposure frame generally 14, a control panel 16 and a roll 17 of film. A drawer 18 for post exposure treatment is provided in the side of the housing.

Figure 2:
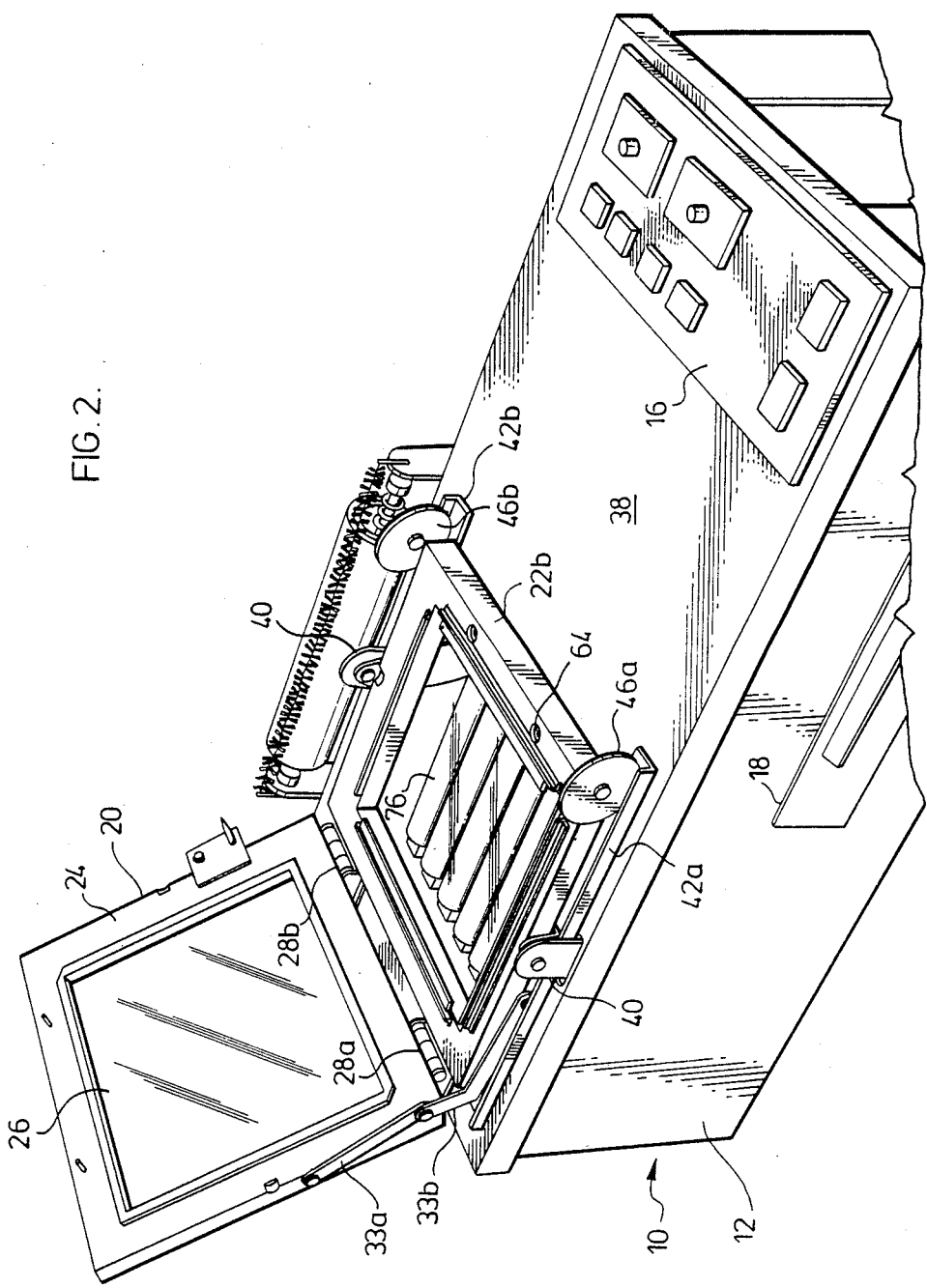
FIG. 2 is another perspective view of a portion of the apparatus showing the exposure frame in an open position.

With reference to FIGS. 1 and 2, the exposure frame is composed of two platens 20,22. Each platen is of similar construction and is made up of a frame 24 having a mortised ridge on its inner edge upon which a plate 26 is seated. The plate will usually be composed of glass but may be composed of any other material which may be penetrated by actinic rays.

The platens are interconnected by means of a pair of hinges 28a,b and U-shaped brackets 30a,b (FIG. 1). As illustrated, the lower limb of each bracket 30 is attached to the lower wall of platen 22 and the upper bracket limb is attached to one leaf of hinge 28. The upper leaf of each hinge is attached to the end wall 20a of platen 20. A handle 31 is connected to a pair of spaced brackets 32a,b and the brackets in turn are connected to the rear wall 22a of platen 22.

A pair of pivotally interconnected support arms 33a,b are pivotally connected to the side wall of each platen. The support arms serve in a conventional manner to hold platen 20 in the open position.

Figure 3:
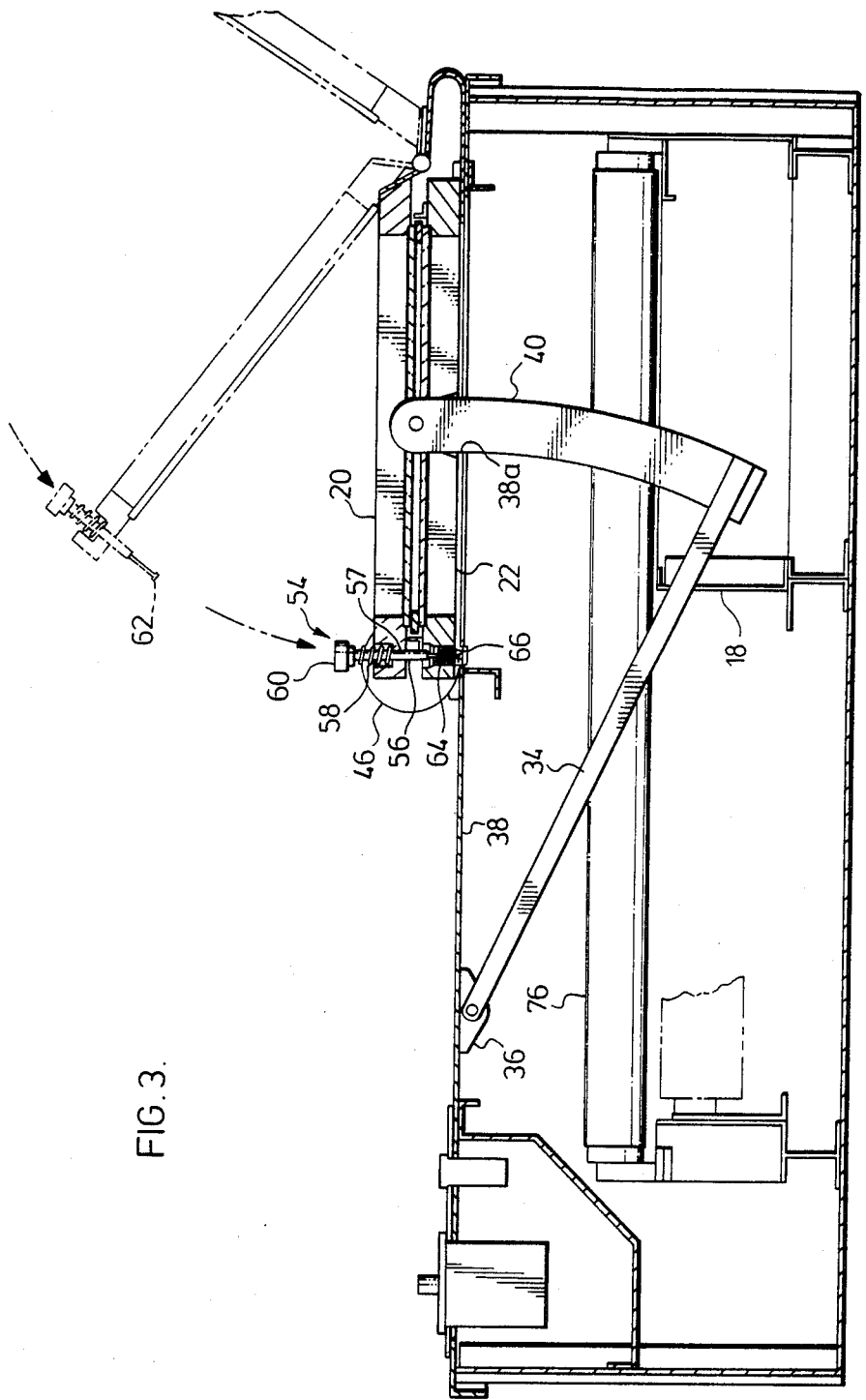
FIG. 3 is an elevation, partly cut away, of the apparatus of the invention.

With reference to FIG. 3, a lever 34 is pivotally connected at 36 to the underside of the upper wall 38 of the housing. The other end of the lever is attached to a curved rocker arm 40. The rocker arm passes through an opening 38a in the upper housing wall and is pivotally connected to a side wall of platen 22. A lever and rocker arm of identical construction are connected to the opposite side wall of the lower platen as can be seen is FIG. 1. The two levers and rocker arms are rigidly interconnected by means of a rod (not illustrated) which extends between and is connected to the two levers adjacent to the lower end of each.

With further reference to FIG. 2, a pair of L shaped tracks 42a,b are seated on the upper housing wall 38. A pair of wheels 46a,b are rotatably mounted to the side walls of platen 22 adjacent to its front wall 22b.

Figure 4:
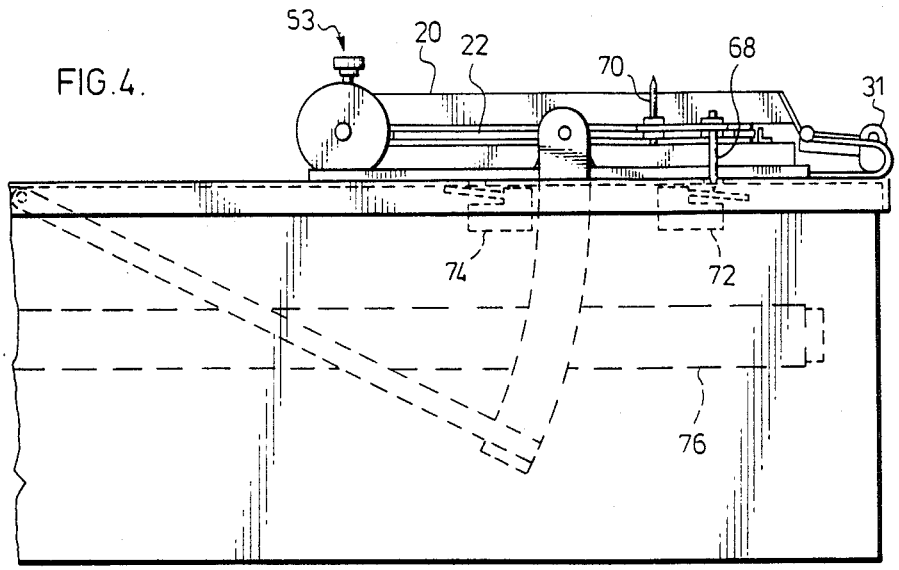
Figure 5:
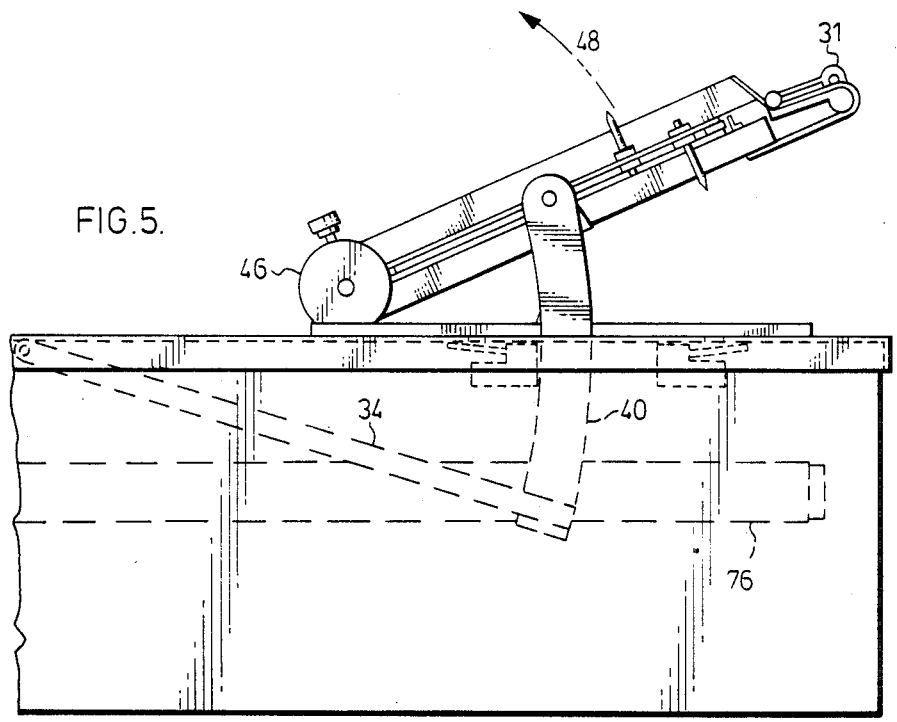

By means of the levers, rocker arms and wheels described above the positions of the two platens may be reversed. The way in which this is accomplished is described with reference to FIGS. 4, 5 and 6. FIG. 4 shows the two platens in the same position as they are shown in FIG. 1. In order to reverse their positions, the two platens are manually lifted by means of handle 31 in the direction of arrow 48 in FIG. 5. As the platens rise so too do levers and rocker arms 34 and 40 respectively. The rigid interconnection of the lever and rocker arm on one side of the platens to the lever and rocker arm on the other side ensures that the platens move smoothly without tilting or binding.

Elevation of the platens results in pivotal movement of the platens both about wheels 46 and about the connection of the platens with the rocker arms 40. At the same time the wheels 46 rotate in tracks 42 in the direction of arrow 50 in FIG. 6. Further pivoting of the platens in the direction of arrow 52 in the latter figure causes the platens to assume the position shown in solid lines in that figure in which the platen 20, previously lying above platen 22 is now beneath the latter platen. The platens are returned to the original position in the same manner.

The ends of the platens opposite the hinges are releasably interconnected by means of a pair of fasteners. In FIG. 3, the fastener, generally 54, is composed of a plunger 56 which is sideably mounted in an opening 57 which penetrates the forward end of platen 20. Resilient means in the form of a compression spring 58 is disposed co-axially about the plunger. A head 60 and a locking pin 62 are disposed at opposite ends of the plunger for maintaining the plunger in the opening. A receptacle 64 for each plunger is formed in the frame of platen 22 (FIGS. 2 and 3). The receptacle is in registry with the opening in platen 20 when the two platens are disposed in a closed position. The bottom wall 66 of the receptacle has an opening which conforms to the cross-section of pin 62 so that the pin may pass therethrough to the position illustrated in solid lines in FIG. 3. When the pin is so positioned, rotation of the plunger will cause the pin to contact the lower wall of the platen frame and to lock the plunger in the receptacle.

When the plunger is rotated until the pin returns to the position at which it is in registry with the opening at the bottom of the receptacle, the plunger will withdraw from the receptacle by reason of the upward force applied to the plunger by the compression spring 58.

In place of the fastener 54 described above, a fastener identified by the trade mark CAMLOC may be used. That fastener performs in the same manner as the fastener described above except that it may be locked and unlocked simply by pressing the plunger downward. There is no necessity to rotate the plunger to cause it to lock and unlock.

With reference to FIG. 4 downwardly and upwardly extending pins 68, 70 respectively are mounted to a bracket 71 which is bolted to platen 20. The pins serve to close normally open switches 72, 74 which are mounted to the upper housing wall. As illustrated pin 68 closes switch 72 when the two platens are closed and platen 20 is disposed above platen 22. Similarly pin 70 closes switch 74 when the two platens are closed but when platen 22 is above platen 20. The two switches 72, 74 are connected in parallel with each other and in series in the circuit which activates the lamps which produce the actinic rays so that the lamps are not activated unless the platens are closed whether in a normal or reverse position.

The lamps 76 which produce actinic rays are illustrated in FIGS. 2, 3 and 8. Those lamps are mounted in a side by side relationship within the housing. The lamps extend beneath the exposure frame and above the post exposure drawer 18. Reflectors 77a,b are positioned below and above the lamps respectively in order to direct the actinic rays onto the exposure frame and onto the post exposure drawer.

With reference to FIG. 1, roll 17 is mounted for rotation on brackets 78,80 which project outwardly from a side wall of the housing. The roll consists of protective film such as clear mylar. A length of copper tinsel 82 is mounted above the roll for removing static electricity beneath the film as it is being drawn over the tinsel and onto the platens.

OPERATION OF THE APPARATUS

The means by which a relief printing plate may be produced by means of the apparatus of the invention is described with reference to FIGS. 7-10. With reference first to FIG. 7, the exposure frame is unlocked from the illustrated position by depressing and rotating the plunger of both fasteners 54 in the manner described above. The exposure frame is then opened by lifting and swinging the upper platen 20 to the position illustrated in FIG. 9. Pin 68 no longer contacts switch 72 thus the electrical input to the lamps is interrupted thereby preventing accidental initiation of an exposure cycle.

A negative 84 from which a relief printing plate is to be formed is placed on the plate 26a so that the image when viewed from above is the image desired on the printing plate. Two bearer strips 86,88 are placed on the printing plate one being placed adjacent to the forward wall 22b of the platen and the other adjacent to its rear wall. Further flow restricting strips or dams 90,92 may be placed adjacent to the two side walls of the platens to prevent the composition from flowing outwardly from the sides of the platens. The dams are thinner than the bearer strips.

Protective film 94 is unrolled from roll 17 over the tinsel and onto the plate. Sufficient film is used so that the entire plate 26a including the bearer strips and dams is covered by the film. The film is then cut and liquid photo-sensitive composition 95 is spread over the protective film. Sufficient composition is used to ensure that the cavity bounded by the platens is full and is free from voids.

A substrate sheet 96 such as mylar is then placed on top of the liquid composition. The substrate sheet is of transparent or translucent material which may be penetrated by actinic rays. The sheet is preferable approximately one tenth of a millimeter in thickness and is coated by conventional means in order to cause it to bond to the photocured film.

Platen 20 is then closed and locked by means of fasteners 54. The upper and lower glass plates of the platens rest upon and are spaced apart by bearer strips 86,88. The thicker the bearer strips the deeper will be the cavity between the two plates and conversely the thinner the bearer strips the shallower the cavity will be. Provided the cavity is filled with photo-sensitive composition, the thickness of the bearer strips will govern the thickness of the finished printing plate.

The two platens 20,22 are movable toward and away from each other to accommodate bearer strips of varying thickness by reason of the construction of the exposure frame. The ends of the platens adjacent to the brackets 30a,b are so movable because the brackets are composed of resiliently deformable material such as annealed spring steel or tempered steel which open to accommodate bearer strips of increasing thickness. Similarly at the forward end of the platens, the compression springs of fasteners 54 while normally maintaining the platens in contact with each other, compress resiliently under pressure from bearer strips of increasing thickness thereby permitting the platens to separate from on another to accommodate those strips.

After the platens have been locked closed, they are allowed to remain stationary for several seconds to allow the composition sufficient time to flow outwards and fill the space between the cover film and the substrate. Excess composition will flow outwardly through the space between the bearer strips and the dams.

The period of time during which the platens remain stationary should generally not exceed a matter of seconds so that the photo-sensitive composition remains under pressure during the subsequent steps when it is exposed to actinic rays. A slight pressure during these steps is necessary to ensure that the finished printing plate has a uniform thickness. Such pressure causes the composition to flow to fill the cavity. In the absence of such pressure there may be voids in the cavity resulting in undesirable indentations or ripples in the finished printing plate.

Figure 6:
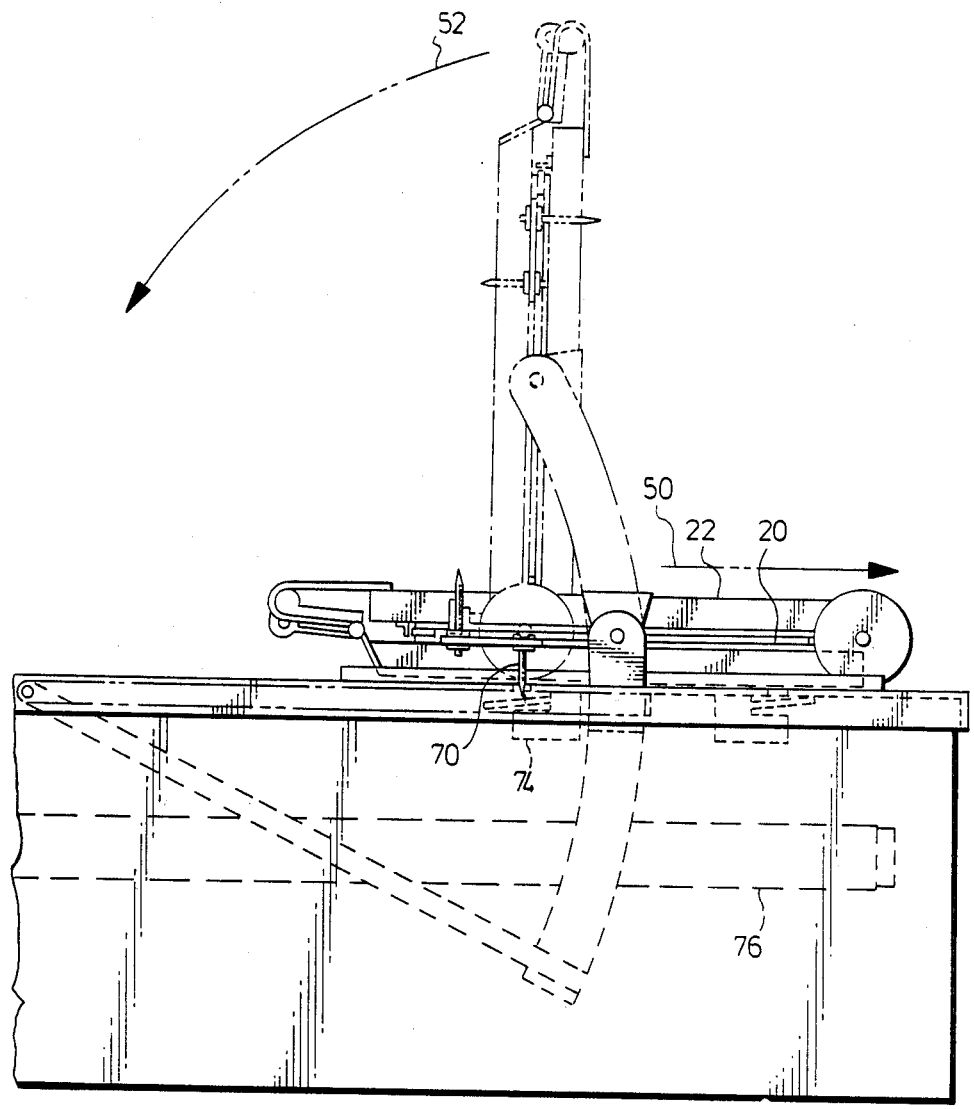
Figure 9:
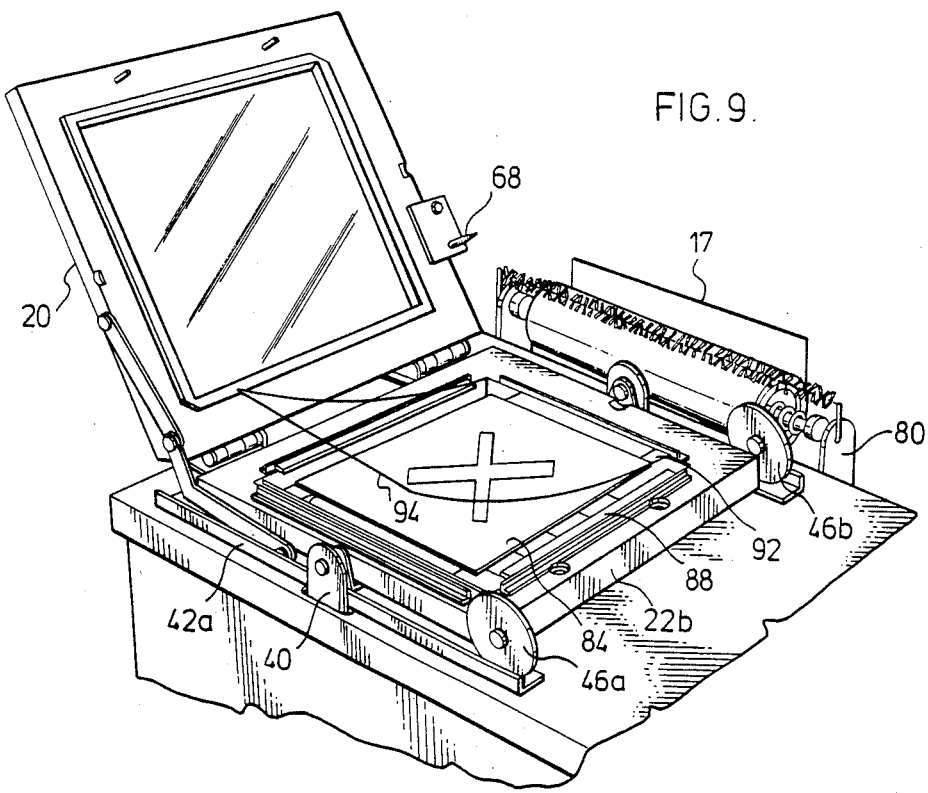
FIGS. 9 and 10 are perspective views of the exposure frame during formation of a printing plate.
Figure 10:
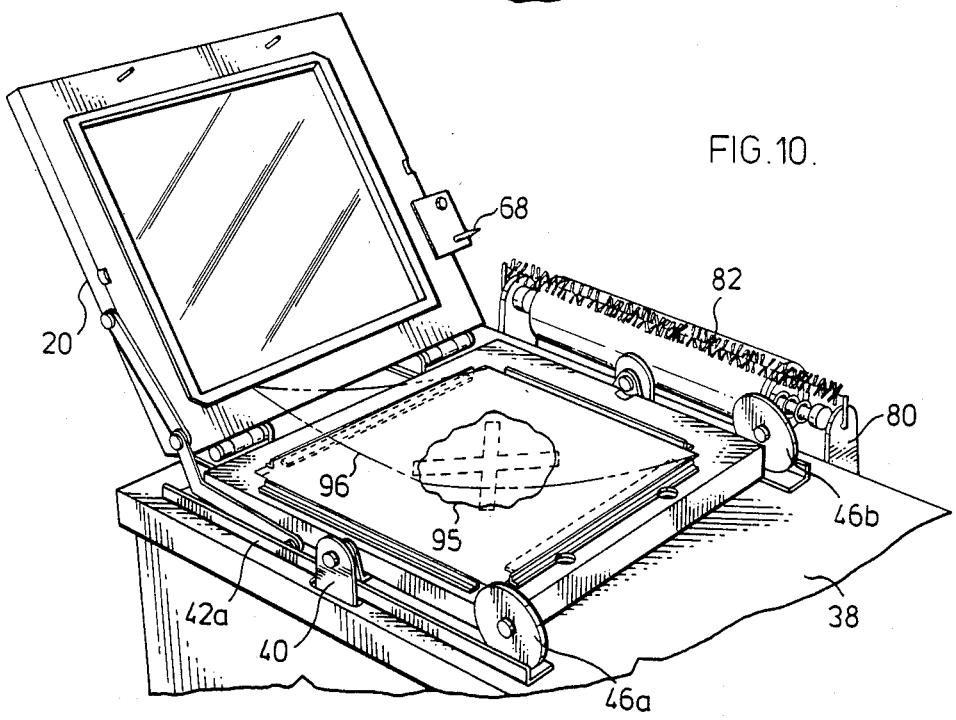

The exposure frame is then inverted to the position illustrated in full lines in FIG. 6. In that position pin 70 will close switch 74. The circuit which activates lamps 76 is then activated by closing of a switch at the control panel. The circuit incorporates a timer (not illustrated) for controlling the length of time that the lamps 76 are illuminated.

Since the negative will be above the photo-sensitive composition while the exposure frame is in this inverted position, it will not interfere with exposure of the photo-sensitive composition to the actinic rays. Accordingly the rays will cause the lower layer of composition which is closest to the rays to form a base or floor of generally uniform thickness. The thickness of the base will depend upon the length of time that the composition is exposed to the rays, the longer the exposure the greater the thickness and vice versa.

When the composition has been exposed to the rays for a sufficient time to produce a base of desired thickness, the exposure frame is pivoted back to the position illustrated in FIG. 7. A control switch is then closed in order to expose the opposite side of the composition to actinic rays. Since the negative is now beneath the composition the negative will govern which areas are exposed to and photocured by the rays and a timer is incorporated into the circuit which activates the lamps to permit control of the exposure time.

The exposure time will be at least sufficient to ensure that the rays penetrate as far as the base so that the raised image is anchored to the base. A longer exposure time will result in an increase in the angle between the shoulder or wall which extends downwardly from the upper surface of the image to the base and a line drawn normal to the base.

After the exposure is complete the fasteners 54 are unlocked and the platens opened. The exposed product and substrate are removed from the exposure frame and washed by conventional means to remove unexposed uncured composition. The washed plate is then immersed in an aqueous solution in the post-exposure drawer 18 and is left there to expose it to further actinic rays during the formation of one or more additional plates in order to complete the formation of the printing plate.

It will be understood of course that modifications can be made in the preferred embodiment described herein without departing from the scope and purview of the invention as defined in the appended claims.

What I claim as new and desire to protect by Letters Patent of the United States is:

1. In an apparatus for forming a relief printing plate from a photo-sensitive composition having a source of actinic rays, said apparatus comprising: an exposure frame having a pair of plates through which actinic rays may pass and being spaced apart to define a cavity for accommodation of an image bearing negative and a layer of photo-sensitive composition therebetween; means for adjusting the distance between said plates while maintaining the said plates parallel to one another for selective enlargement or reduction of said cavity such that the thickness of said layer of photo-sensitive composition can be adjusted; and resilient means disposed at opposite edges of said plates for resiliently biasing said plates toward each other and yielding resiliently as the space between said plates is selectively enlarged to thereby apply a uniform (with resulting) inward pressure upon said composition. (said resilient means permitting enlargement of said cavity such that the thickness of said layer of photo-sensitive composition can be adjusted.)

2. The apparatus as claimed in claim 1 wherein said one resilient means is in the form of a U shaped bracket.

3. The apparatus as claimed in claim 1 wherein said plates are movable from a position in which one said plate faces said source to another position in which the other said plate faces said source such that opposite sides of said composition can be successively exposed to said actinic rays.

4. The apparatus as claimed in claim 1 wherein said plates are pivotally interconnected.

5. An apparatus for forming a relief printing plate from a photo-sensitive composition comprising: a source of actinic rays; and an exposure frame disposed in the path of rays from said source and having a pair of plates through which actinic rays may pass and being spaced apart to accommodate an image bearing negative and a layer of photo-sensitive composition therebetween, said plates being movable from a position in which one said plate faces said source to another position in which the other said plate faces said source such that opposite sides of said composition can be successively exposed to said actinic rays.

6. The apparatus as claimed in claim 5 further including resilient means for biasing opposite edges of said plates toward each other with resulting inward pressure upon said composition, said resilient means permitting enlargement of said cavity such that the thickness of said layer of photo-sensitive composition can be adjusted.

7. In an apparatus for forming a relief printing plate from a photo-sensitive composition having a source of actinic rays, said apparatus comprising: an exposure frame having a pair of plates through which actinic rays may pass, said plates being spaced apart to define a cavity for accommodation of an image bearing negative and a layer of photo-sensitive composition therebetween; and resilient means for biasing said plates toward each other with resulting inward pressure upon said composition, said resilient means permitting enlargement of said cavity such that the thickness of said layer of photo-sensitive composition can be adjusted, each of said plates being seated upon a platen and said resilient means including a U shaped bracket having a pair of spaced apart limbs, one said limb being connected to one said platen and the other said limb being connected by pivotal means to the other said platen, separation of said plates causing resilient outward deformation of said limbs.

8. In an apparatus for forming a relief printing plate from a photo-sensitive composition having a source of actinic rays, said apparatus comprising: an exposure frame having a pair of plates through which actinic rays may pass, said plates being spaced apart to define a cavity for accommodation of an image bearing negative and a layer of photo-sensitive composition therebetween; and resilient means for biasing said plates toward each other with resulting inward pressure upon said composition, said resilient means permitting enlargement of said cavity such that the thickness of said layer of photo-sensitive composition can be adjusted, each of said plates being seated upon a platen and said resilient means including a U shaped bracket having a pair of spaced apart limbs, one said limb being connected to one said platen and the other said limb being connected by pivotal means to the other said platen, separation of said plates causing resilient outward deformation of said limbs, said resilient means further including means biasing the portions of said plates remote from said pivotal connection toward each other but being releasable to permit pivotal opening of one said plate relative to the other said plate.

9. In an apparatus for forming a relief printing plate from a photo-sensitive composition having a source of actinic rays, said apparatus comprising: an exposure frame having a pair of plates through which actinic rays may pass and being spaced apart to define a cavity for accommodation of an image bearing negative and a layer of photo-sensitive composition therebetween; and resilient means for biasing said plates toward each other with resulting inward pressure upon said composition, said resilient means permitting enlargement of said cavity such that the thickness of said layer of photo-sensitive composition can be adjusted, each said plate being seated upon a platen, said apparatus further including a lever pivotally connected to said housing, a rocker arm pivotally connected to one said platen and connected to said lever and a track along which said one platen moves.

10. In an apparatus for forming a relief printing plate from a photo-sensitive composition having a source of actinic rays, said apparatus comprising: an exposure frame having a pair of plates through which actinic rays may pass and being spaced apart to define a cavity for accommodation of an image bearing negative and a layer of photo-sensitive composition therebetween; resilient means for biasing said plates toward each other with resulting inward pressure upon said composition, said resilient means permitting enlargement of said cavity such that the thickness of said layer of photo-sensitive composition can be adjusted; and a pivotal connection between said plates, one said resilient means being integral with said pivotal connection; and another said resilient means biasing the portions of said plates remote from said pivotal connection toward each other but being releasable to permit pivotal opening of one said plate relative to the other said plate.

11. An apparatus for forming a relief printing plate from a liquid photo-sensitive composition comprising: a housing within which is mounted a source of actinic rays; and exposure frame disposed in the path of rays from said source and having a pair of horizontally disposed interconnected plates through which actinic rays may pass and being spaced apart to accommodate an image bearing negative and a layer of photo-sensitive composition therebetween; a lever pivotally connected to said housing; a rocker arm pivotally connected to said lever and to one said plate; a wheel rotatably mounted to one said plate, said lever, rocker arm and wheel cooperating to permit rotation of said plates about said wheel from one position in which one said plate faces said source to another position in which the other said plate faces said source.

* * * * *